(12) United States Patent
Humphrey et al.

(10) Patent No.: US 9,379,690 B2
(45) Date of Patent: Jun. 28, 2016

(54) DUTY CYCLE CONTROLLER

(71) Applicant: Allegro Microsystems, LLC, Worcester, MA (US)

(72) Inventors: George P. Humphrey, Merrimack, NH (US); William E. Martin, Bedford, NH (US)

(73) Assignee: ALLEGRO MICROSYSTEMS, LLC, Worcester, MA (US)

( * ) Notice: Subject to any disclaimer, the term of this patent is extended or adjusted under 35 U.S.C. 154(b) by 192 days.

(21) Appl. No.: 14/187,545

(22) Filed: Feb. 24, 2014

(65) Prior Publication Data

US 2015/0244353 A1    Aug. 27, 2015

(51) Int. Cl.
*H03K 3/017* (2006.01)
*H03K 5/156* (2006.01)

(52) U.S. Cl.
CPC .............. *H03K 3/017* (2013.01); *H03K 5/1565* (2013.01)

(58) Field of Classification Search
USPC ........................................................ 327/175
See application file for complete search history.

(56) References Cited

U.S. PATENT DOCUMENTS

| | | | | |
|---|---|---|---|---|
| 5,539,343 A * | 7/1996 | Yamashita | ............... | H04N 5/06 327/142 |
| 5,563,605 A * | 10/1996 | McEwan | ................ | H03K 5/135 342/202 |
| 7,552,016 B2 | 6/2009 | Vig et al. | | |
| 7,710,214 B2 * | 5/2010 | Li | ............................. | H03K 7/08 327/172 |
| 2008/0043128 A1* | 2/2008 | Poonnen | ............... | H03M 1/123 348/294 |
| 2009/0115391 A1* | 5/2009 | Chuang | .................... | H03K 3/72 323/283 |
| 2012/0119788 A1* | 5/2012 | Turner | ............. | G01R 19/16552 327/57 |
| 2013/0099834 A1* | 4/2013 | Oshima | .................... | H03K 4/58 327/131 |

* cited by examiner

*Primary Examiner* — Lincoln Donovan
*Assistant Examiner* — Patrick Chen
(74) *Attorney, Agent, or Firm* — Daly, Crowley, Mofford & Durkee, LLP

(57) ABSTRACT

In one aspect, a duty cycle controller includes a first port configured to receive a voltage bias signal, a second port configured to receive an input voltage signal, a third port configured to provide an output signal of the duty cycle controller having a duty cycle and a n-bit digital-to-analog converter (DAC) configured to receive the voltage bias signal and to provide a DAC output signal to a comparator. The DAC output signal has a peak value. The duty cycle controller also includes the comparator configured to compare the DAC output signal from the n-bit DAC with the input voltage signal to provide a comparator output signal. The comparator output signal is used to provide the output signal of the duty cycle controller and the duty cycle changes with changes to the input voltage signal.

30 Claims, 2 Drawing Sheets

DUTY CYCLE CONTROLLER

BACKGROUND

A variety of electronic circuits (i.e., drivers) are used to drive loads. One way to control power to these loads is to control a duty cycle of a driver. Loads, more particularly, may include strings of series-connected light-emitting diodes (LEDs), which, in some examples, form an LED display, or, more particularly, a backlight for a display, for example, a liquid crystal display (LCD). Thus, changing the duty cycle can change the brightness of the LEDs.

SUMMARY

In one aspect, a duty cycle controller includes a first port configured to receive a voltage bias signal, a second port configured to receive an input voltage signal, a third port configured to provide an output signal of the duty cycle controller having a duty cycle and a n-bit digital-to-analog converter (DAC) configured to receive the voltage bias signal and to provide a DAC output signal to a comparator. The DAC output signal has a peak value. The duty cycle controller also includes the comparator configured to compare the DAC output signal from the n-bit DAC with the input voltage signal to provide a comparator output signal. The comparator output signal is used to provide the output signal of the duty cycle controller and the duty cycle changes with changes to the input voltage signal.

In another aspect, an integrated circuit (IC) includes a first pin configured to receive a voltage bias signal, a second pin configured to receive an input voltage signal, a third pin configured to provide a duty cycle signal having a duty cycle and a n-bit digital-to-analog converter (DAC) configured to receive the voltage bias signal and to provide a DAC output signal to a comparator. The DAC output signal has a peak value. The IC also includes the comparator configured to compare the DAC output signal from the n-bit DAC with the input voltage signal to provide a comparator output signal. The comparator output signal is used to provide the output signal of the duty cycle controller and the duty cycle changes with changes to the input voltage signal.

In a further aspect, a method includes providing an integrated circuit (IC) comprising a first pin to provide an output signal, setting a duty cycle of the output signal in response to: a first resistor, R1, coupled to a second pin of the IC and a voltage bias, a second resistor, R2, coupled to the first resistor and a third pin of the IC, and a clock signal provided to a fourth pin of the IC.

DETAILED DESCRIPTION

Figure 1:
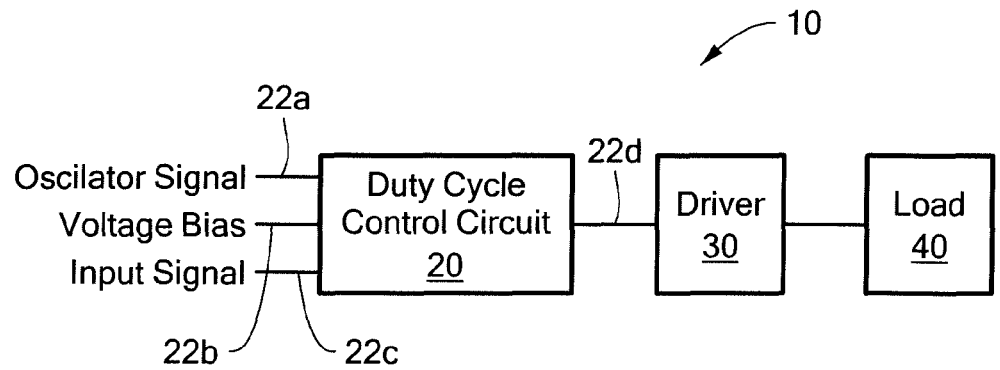
FIG. 1 is a block diagram of a system that includes a duty cycle controller.

Described herein are techniques to control a duty cycle. For example, a duty cycle control circuit is described that provides a signal that controls a duty cycle of a driver in response to changes to an input voltage signal to the duty cycle control circuit. The techniques herein do not require a capacitor or trim, provide more accurate duty cycle control and have less variation from temperature changes. As will be shown further herein, the duty cycle is independent of the frequency of a clock signal. Further, the duty cycle controller described herein may still function even when using different voltage bias values.

The various connections described herein may be referred to herein interchangeably with the signal carried by the respective connection. For example, reference character $122c$ may be used interchangeably to refer to the connection between the n-bit counter 118 and the latch circuit 126 and a signal associated with such a connection.

Referring to FIG. 1, a system 10 includes a duty cycle control circuit 20, a driver 30 and a load 40. The duty cycle control circuit 20 receives an oscillator signal $22a$ (e.g., a clock signal), a voltage bias signal $22b$ (i.e., a fixed voltage) and an input voltage signal $22c$ and generates an output signal $22d$. By changing the input voltage signal $22c$, the duty cycle control circuit 20 changes the duty cycle of the output signal $22d$. In one example, the driver 30 is a field effect transistor. In one example, the load 40 is one or more light emitting diodes (LEDs) that may, in one particular example, form a liquid crystal display (LCD) display.

Figure 2:
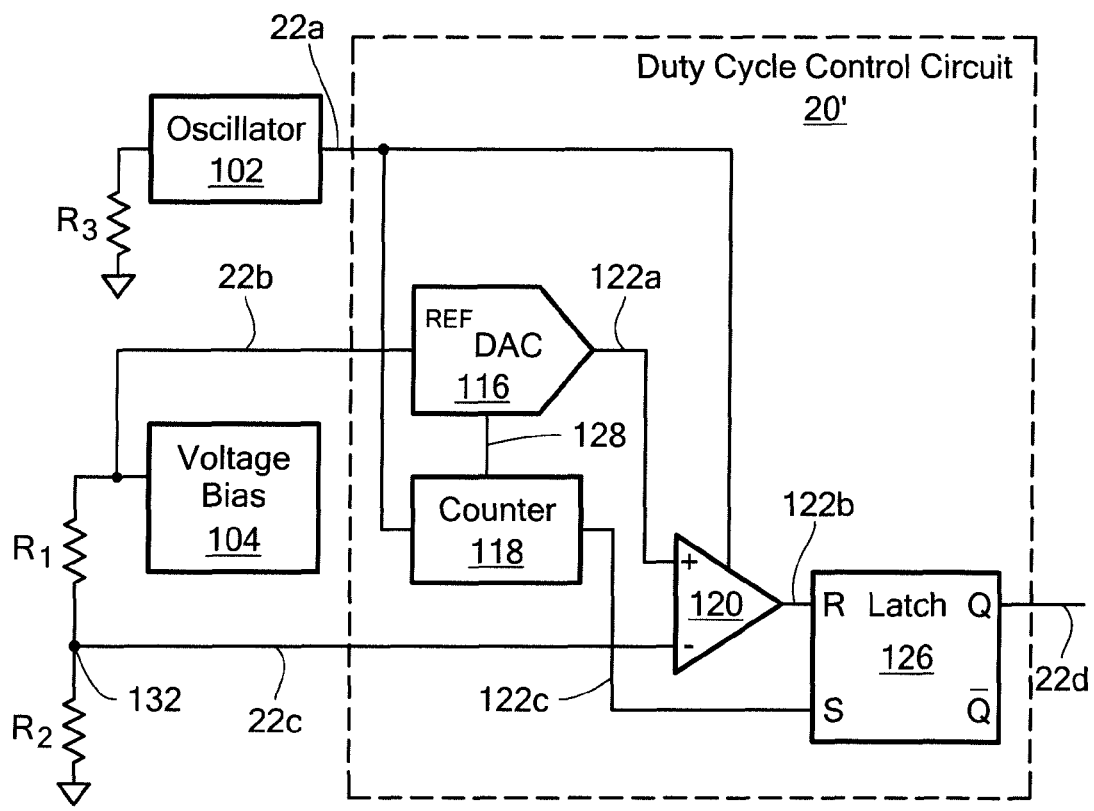
FIG. 2 is a circuit diagram of an example of the duty cycle controller.

Referring to FIG. 2, an example of a duty cycle control circuit 20 is a duty cycle control circuit 20'. The duty cycle control circuit 20' includes a digital-to-analog converter (DAC) 116 (i.e., an n-bit DAC), a counter 118 (i.e., an n-bit counter), a comparator 120 and a latch circuit 126.

The DAC 116 receives the voltage bias signal $22b$ from a voltage bias 104, which is coupled to ground through a resistor $R_1$ and a resistor $R_2$; and provides a DAC output signal $122a$ to the comparator 120. In one example, the DAC 116 is a 10-bit DAC. In general, the more bits used by the DAC 116 the better resolution the DAC output provides, which in turn provides a more accurate duty cycle control.

In one example, the duty cycle control circuit 20' is formed on an integrated circuit (IC). One or more of the oscillator 102, the voltage bias 104, the input voltage signal $22c$ and the resistors $R_1$, $R_2$ and $R_3$ are provided off-chip (i.e., external to the IC). For example, the oscillator signal $22a$ is provided to a first pin on the IC, the voltage bias signal $22b$ is provided to a second pin on the IC and the input voltage signal $22c$ is provided to a third pin on the IC. In one particular example, the voltage bias 104 is provided by another pin on the IC.

The counter 118 receives the oscillator signal $22a$ from an oscillator 102 which is coupled to ground through a resistor $R_3$ and provides a maximum count value signal $122c$ to an S port of the latch circuit 126. In one example, the maximum count value signal $122c$ is high when the counter 118 reaches the maximum count value. In some examples, the maximum count value is the maximum count possible. For example, for a 10-bit counter the maximum count possible is 1111111111. In other examples, the maximum count value is less than the maximum count possible. For example, for a 10-bit counter, a value of 1010111110 may be selected as the maximum count value.

The counter 118 is also coupled to the DAC 116 by n connections 128 and is configured to provide to the DAC 116 a signal for each of the n bits. The counter 118 provides values from zero to the maximum count value to the n-bit DAC 116. For example, if the DAC 116 is a 10-bit DAC there would be ten connections 128 coming from the counter 118, which would be a 10-bit counter. In one example, each connection of the n connections 128 is connected to a respective flip-flop (not shown) in the counter 118 and the flips flops are tied in series.

The comparator 120 receives, at a negative terminal, the input voltage signal 22c from a node 132 between the resistor $R_1$ and the resistor $R_2$. The input voltage signal 22c is equal to $(R_2/(R_1+R_2))$ times the Voltage Bias. The comparator 120 receives, at a positive terminal, the DAC output signal 122a and provides a comparator output signal 122b to an R port of the latch circuit 126. The comparator output signal 122b is high when the DAC output signal 122a is above the input voltage 22c.

The comparator 120 also receives the oscillator signal 22a. The comparator 120 uses the oscillator signal 22a to remove or blank out artifacts from the DAC 116. For example, the DAC 116 may produce artifacts after each clock signal trigger. In other examples, the DAC 116 does not produce any artifacts so that the comparator 120 does not need to be configured to remove artifacts.

The latch circuit 126 provides the output signal 22d of the duty cycle control circuit 20' from a Q port. The output signal 22d is high when the DAC output signal 122a is below the input voltage 22c. The maximum count value signal 122c received at the S port of the latch circuit 126 resets the latch circuit.

In operation, when the oscillator signal goes from low to high, for example, the counter 118 increments in a binary fashion. In particular, the counter 118 increases from zero to the maximum count value and then resets to zero. For example, with 10-bits the n-bit connections provides a 0000000000 value initially and after the oscillator signal 22a goes from low to high the counter 118 provides a 0000000001 value. In one example, if the maximum count value is 1111111111, the values increase until the 1111111111 value is achieve and then after the next clock signal trigger, the counter 118 resets to a 0000000000 value. In another example, if the maximum count value is 1010111110, the counter 118 is reset after the 1010111110 value is reached where the 1010111110 value is 702 in decimal numbers.

Figure 3A:
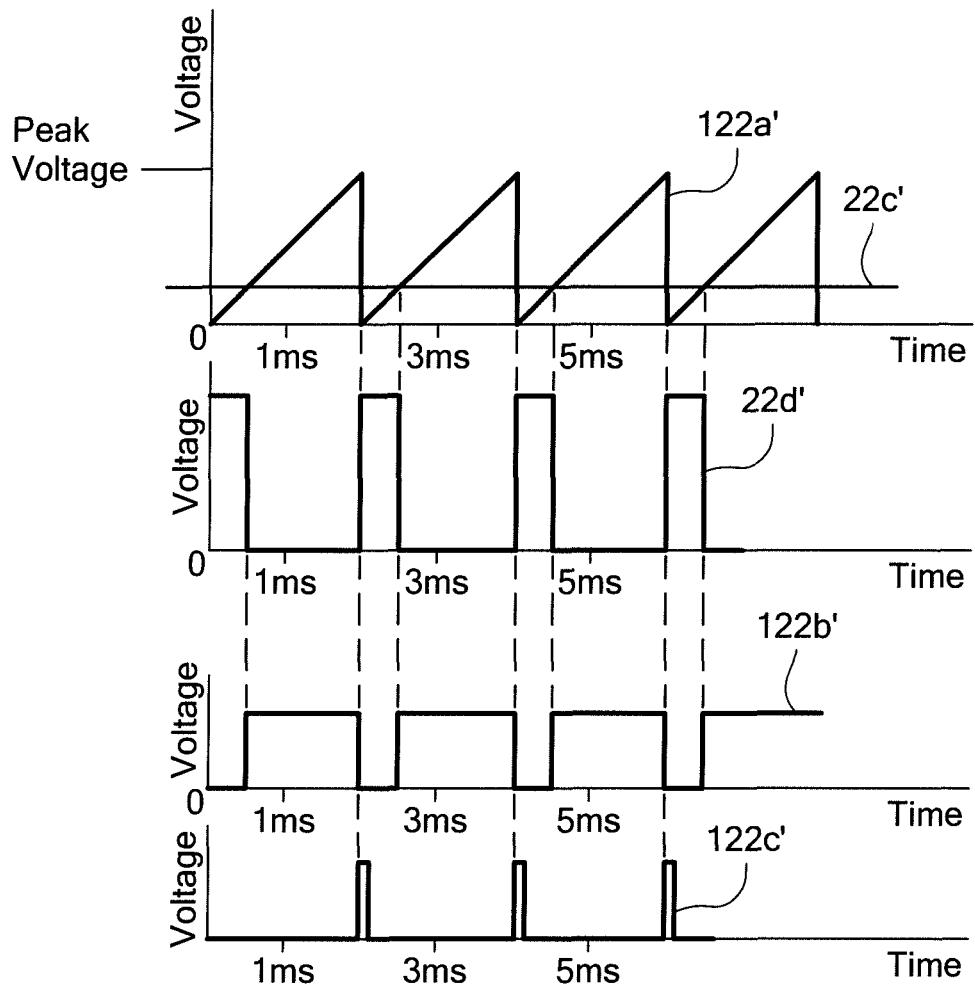
FIG. 3A are waveform timing diagrams of signals used with the duty cycle control circuit.

Referring to FIG. 3A, the DAC 116 provides the DAC output signal 122a as a sawtooth waveform. A peak voltage value of the sawtooth corresponds to the maximum count value. In one example, the DAC output signal 122a is the DAC output signal 122a'. In one example, the DAC output signal 122a' increases from zero volts to a peak voltage value equal to the voltage bias 104 when the maximum count value is the maximum count value possible. In one particular example, for a 10-bit DAC, the maximum count value is 1111111111 and the output voltage increases in 1024 steps where zero equals 0 volts and 1024 equals the voltage bias 104.

In another example, the DAC output signal 122a' increases from zero volts to a peak voltage value that is less than the voltage bias 104. In one particular example, for a 10-bit DAC, the maximum count value is 1010111110 and the output voltage increases in 702 steps where zero equals 0 volts and 702 equals 0.685547 times the voltage bias 104 (e.g., if the voltage bias is 5.25 volts the DAC output signal 122a' increases from zero volts to 3.6 Volts) where 702/1024 equals 0.685547.

An example of the output signal 22d is an output signal 22d' and an example of the input voltage 22c is the input voltage 22c'. The output signal 22d' is high when the DAC output signal 122a' is below the input voltage 22c'. Thus, as the input voltage signal 22c' increases the duty cycle of the output signal 22d' increases. The duty cycle is equal to:

$$[((\text{Voltage Bias})/(\text{Peak Voltage Value})*R2)/(R1+R2)]*100\%, \text{ or}$$

$$[(\text{Input Voltage})/(\text{Peak Voltage Value})]*100\%,$$

where the Peak Voltage Value is the peak voltage value of the DAC output signal 122a. If the peak value voltage is equal to the voltage bias, then the duty cycle is equal to:

$$[(R2)/(R1+R2)]*100\%, \text{ or}$$

$$[(\text{Input Voltage})/(\text{Voltage Bias})]*100\%,$$

An example of the comparator output signal 122b is a comparator output signal 122b'. The comparator output signal 122b' is high when the DAC output signal 122a' is above the input voltage 22c'.

An example of the maximum count value signal 122c is a maximum count value signal 122c'. The maximum count value signal 122c' is high when the DAC output signal 122a' reaches its peak value which corresponds to the counter 118 reaching the maximum count value.

Figure 3B:
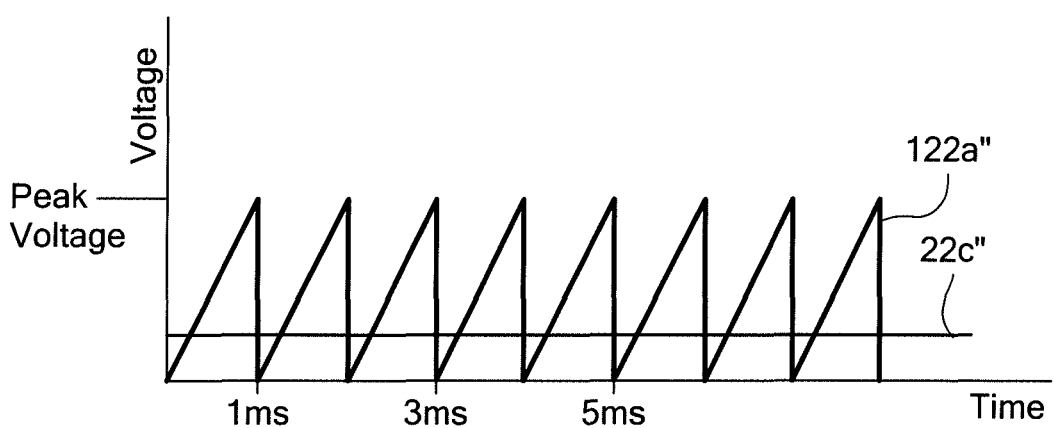
FIG. 3B is a waveform diagram of an example of a DAC output signal and an example of an input signal to the duty cycle controller.

Referring to FIG. 3B, another example of a DAC output signal 122a is the DAC output signal 122a" and another example of the input voltage 22c is the input voltage 22c". The input voltage 22c" is the same as the input voltage 22c'. The DAC output signal 122a" has the same peak value as the DAC output signal 122a'; however, the DAC output signal 122a" has twice the frequency of the DAC output signal 122a', which means the oscillator signal 22a has twice the frequency. Even though the frequency of the oscillator signal 22a has doubled, the duty cycle remains the same. Thus the duty cycle of the output signal 22d is independent of the input signal 22c.

The voltage bias signal 104 may be as low as 1.5 volts, for example, for the duty cycle control circuit 20' to function.

Elements of different embodiments described herein may be combined to form other embodiments not specifically set forth above. Other embodiments not specifically described herein are also within the scope of the following claims.

What is claimed is:

1. A duty cycle controller comprising:
  a first port configured to receive a voltage bias signal;
  a second port configured to receive an input voltage signal;
  a third port configured to provide an output signal of the duty cycle controller having a duty cycle;
  a n-bit digital-to-analog converter (DAC) configured to receive the voltage bias signal and to provide a DAC output signal to a comparator, the DAC output signal having a peak value;
  the comparator configured to compare the DAC output signal from the n-bit DAC with the input voltage signal to provide a comparator output signal; and
  a latch circuit configured to:
    receive a signal from the n-bit counter;
    receive the comparator output signal from the comparator; and
    provide the output signal,
  wherein the comparator output signal is used to provide the output signal of the duty cycle controller, and
  wherein the duty cycle changes with changes to the input voltage signal.

2. The duty cycle controller of claim 1, wherein the duty cycle increases with increases to the input voltage signal.

3. The duty cycle controller of claim 1, wherein the duty cycle is equal to the input voltage divided by the peak value of the DAC output signal times 100%.

4. The duty cycle controller of claim 1, further comprising:
a fourth port configured to receive a clock signal; and
an n-bit counter coupled to the n-bit DAC and configured to provide to the n-bit DAC a signal for each n bit in response to the clock signal.

5. The duty cycle controller of claim 4, wherein the comparator uses the clock signal to remove artifacts provided by the n-bit DAC.

6. The duty cycle controller of claim 4 wherein the n-bit counter provides values no greater than a maximum count value to the n-bit DAC.

7. The duty cycle controller of claim 4, wherein the n-bit counter is a 10-bit counter.

8. The duty cycle controller of claim 7, wherein the 10-bit counter provides the maximum count value of 1010111110 which sets the peak value of the DAC output signal to be equal to 0.685547 times the voltage bias signal.

9. The duty cycle controller of claim 4 wherein the duty cycle is independent of the frequency of the clock signal.

10. The duty cycle controller of claim 1, wherein the n-bit DAC is a 10-bit DAC.

11. The duty cycle controller of claim 1, further comprising:
a fourth port configured to receive a clock signal; and
a latch circuit configured to receive the comparator output signal and configured to provide the output signal; and
a n-bit counter coupled to the n-bit DAC and configured to provide to the n-bit DAC a signal for each n bit in response to the clock signal, the n-bit counter providing a maximum count value to the latch circuit.

12. A duty cycle controller comprising:
a first port configured to receive a voltage bias signal;
a second port configured to receive an input voltage signal;
a third port configured to provide an output signal of the duty cycle controller having a duty cycle;
a n-bit digital-to-analog converter (DAC) configured to receive the voltage bias signal and to provide a DAC output signal to a comparator, the DAC output signal having a peak value; and
the comparator configured to compare the DAC output signal from the n-bit DAC with the input voltage signal to provide a comparator output signal,
a first resistor, $R_1$, coupled to the first port; and
a second resistor, $R_2$, coupled to the first resistor and the second port,
wherein the input voltage signal is equal to $R_2/(R_1+R_2)$ times the voltage bias signal,
wherein the duty cycle changes with changes to the input,
wherein the comparator output signal is used to provide the output signal of the duty cycle controller.

13. The duty cycle controller of claim 12, wherein the duty cycle is equal to:

$$[((VB)/(PVV)*R2)/(R1+R2)]*100\%,$$

where PVV is equal to the peak voltage value of the DAC output signal and VB is the voltage bias signal.

14. An integrated circuit (IC) comprising:
a first pin configured to receive a voltage bias signal;
a second pin configured to receive an input voltage signal;
a third pin configured to provide a duty cycle signal having a duty cycle;
a n-bit digital-to-analog converter (DAC) configured to receive the voltage bias signal and to provide a DAC output signal to a comparator, the DAC output signal having a peak value; and
the comparator configured to compare the DAC output signal from the n-bit DAC with the input voltage signal to provide a comparator output signal; and
a latch circuit configured to:
receive a signal from the n-bit counter;
receive the comparator output signal from the comparator; and
provide the output signal,
wherein the comparator output signal is used to provide the output signal of the duty cycle controller, and
wherein the duty cycle changes with changes to the input voltage signal.

15. The IC of claim 14, further comprising a fourth pin configured to provide the voltage bias signal.

16. The IC of claim 14, wherein the duty cycle increases with increases to the input voltage signal.

17. The IC of claim 14, wherein the duty cycle is equal to the input voltage divided by the peak value of the DAC output signal times 100%.

18. The IC of claim 14, further comprising:
a fourth pin configured to receive a clock signal; and
an n-bit counter coupled to the n-bit DAC and configured to provide to the n-bit DAC a signal for each n bit in response to the clock signal.

19. The IC of claim 18, wherein the comparator uses the clock signal to remove artifacts provided by the n-bit DAC.

20. The IC of claim 18 wherein the n-bit counter provides to the n-bit DAC values no greater than a maximum count value.

21. The IC of claim 18, wherein the n-bit counter is a 10-bit counter.

22. The IC of claim 21, wherein the 10-bit counter has the maximum count value of 1010111110 which sets the peak value of the DAC output signal to be equal to 0.685547 times the voltage bias signal.

23. The IC of claim 18 wherein the duty cycle is independent of the frequency of the clock signal.

24. The IC of claim 14, wherein the n-bit DAC is a 10-bit DAC.

25. The IC of claim 14, further comprising:
a fourth pin configured to receive a clock signal; and
a latch circuit configured to receive the comparator output signal and configured to provide the output signal; and
a n-bit counter coupled to the n-bit DAC and configured to provide to the n-bit DAC a signal for each n bit in response to the clock signal, the n-bit counter providing a maximum count value to the latch circuit.

26. An integrated circuit (IC) comprising:
a first pin configured to receive a voltage bias signal;
a second pin configured to receive an input voltage signal;
a third pin configured to provide a duty cycle signal having a duty cycle;
a n-bit digital-to-analog converter (DAC) configured to receive the voltage bias signal and to provide a DAC output signal to a comparator, the DAC output signal having a peak value; and
the comparator configured to compare the DAC output signal from the n-bit DAC with the input voltage signal to provide a comparator output signal;
a first resistor, $R_1$, coupled to the first port; and
a second resistor, $R_2$, coupled to the first resistor and the second port,
wherein the input voltage signal is equal to $R_2/(R_1+R_2)$ times the voltage bias signal,
wherein the comparator output signal is used to provide the output signal of the duty cycle controller, and wherein the duty cycle changes with changes to the input voltage signal.

27. The IC of claim 26, wherein the duty cycle is equal to:

$$[((VB)/(PVV)*R2)/(R1+R2)]*100\%,$$

where PVV is equal to the peak voltage value of the DAC output signal and VB is the voltage bias signal.

28. A method, comprising:

providing an integrated circuit (IC) comprising a first pin to provide an output signal;

setting a duty cycle of the output signal in response to:
- a first resistor, $R_1$, coupled to a second pin of the IC and a voltage bias;
- a second resistor, $R_2$, coupled to the first resistor and a third pin of the IC; and
- a clock signal provided to a fourth pin of the IC, wherein setting the duty cycle of the output signal comprises setting the duty cycle to be equal to:

$$[((VB)/(PVV)*R2)/(R1+R2)]*100\%,$$

where PVV is equal to the peak voltage value of a DAC output signal and VB is the voltage bias.

29. The method of claim 28 wherein setting the duty cycle of the output signal comprises setting the duty cycle to be equal to:

$$[(R2)/(R1+R2)]*100\%,$$

where VB is the voltage bias.

30. The method of claim 28 wherein setting the duty cycle of the output signal comprises setting the duty cycle to be independent of the frequency of the clock signal.

* * * * *